US011792911B2

(12) United States Patent
Tian et al.

(10) Patent No.: US 11,792,911 B2
(45) Date of Patent: Oct. 17, 2023

(54) FLEXIBLE COLD PLATE FOR CONTACTING VARIED AND VARIABLE CHIP HEIGHTS

(71) Applicant: INTERNATIONAL BUSINESS MACHINES CORPORATION, Armonk, NY (US)

(72) Inventors: Shurong Tian, Mount Kisco, NY (US); Todd Edward Takken, Brewster, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 17/304,252

(22) Filed: Jun. 17, 2021

(65) Prior Publication Data
US 2022/0408544 A1 Dec. 22, 2022

(51) Int. Cl.
*H05K 1/02* (2006.01)
*H05K 7/20* (2006.01)
*H01L 23/473* (2006.01)

(52) U.S. Cl.
CPC ....... *H05K 1/0204* (2013.01); *H05K 7/20254* (2013.01); *H01L 23/473* (2013.01)

(58) Field of Classification Search
CPC .......... H05K 7/20254; H05K 7/20772; H05K 7/20872; H05K 1/0203; H05K 1/0204; H01L 23/473
See application file for complete search history.

(56) References Cited

U.S. PATENT DOCUMENTS

| 5,150,274 | A | * | 9/1992 | Okada | ................. H01L 23/4338 361/689 |
| 5,168,348 | A | | 12/1992 | Chu | |
| 8,567,483 | B2 | | 10/2013 | Kamath | |
| 8,736,048 | B2 | | 5/2014 | Schultz | |
| 9,743,558 | B2 | | 8/2017 | Bosak | |
| 10,212,816 | B2 | * | 2/2019 | Rieke | ................. H05K 7/20863 |

(Continued)

FOREIGN PATENT DOCUMENTS

JP 06177320 A 6/1994
JP 06224334 A 8/1994
(Continued)

OTHER PUBLICATIONS

Chen et al., "Direct Liquid Cooling of a Stacked Multichip Module", 2002 Electronics Packaging Technology Conference, © 2002 IEEE, pp. 380-384.
(Continued)

*Primary Examiner* — Zachary Pape
(74) *Attorney, Agent, or Firm* — Samuel A. Waldbaum

(57) ABSTRACT

An apparatus comprising chips mounted to a substrate, wherein one or more of the chips comprises a first height and one or more of the chips comprises a second height, wherein the first height is taller than the second height. A cold plate located above the plurality of chips, wherein the cold plate includes a bottom wall and a top wall, wherein the cold plate includes a plurality of cooling fins that are attached to the bottom wall of the cold plate, wherein the cold plate accommodates the plurality of chips, wherein the chips includes chips having the first height and the second height.

19 Claims, 8 Drawing Sheets

(56) References Cited

U.S. PATENT DOCUMENTS

| | | | |
|---|---|---|---|
| 10,247,489 B2 | 4/2019 | Ahbel | |
| 2005/0141195 A1 | 6/2005 | Pokharna | |
| 2015/0369545 A1* | 12/2015 | Naritomi | F28F 13/06 29/890.03 |
| 2017/0287809 A1 | 10/2017 | Schultz | |
| 2019/0204023 A1* | 7/2019 | Takken | F28F 3/04 |
| 2019/0259632 A1* | 8/2019 | Isaacs | H01L 23/3677 |
| 2021/0111037 A1 | 4/2021 | Isaacs | |

FOREIGN PATENT DOCUMENTS

| | | | |
|---|---|---|---|
| JP | 2002093960 A | 3/2002 | |
| WO | 2020068297 A1 | 4/2020 | |

OTHER PUBLICATIONS

Notification of Transmittal of the International Search Report and the Written Opinion of the International Searching Authority, or the Declaration, dated Oct. 10, 2022, International application No. PCT/EP2022/065360, 10 pages.

TW Office Action and Search Report, dated Nov. 1, 2022, Application No. 111111555, Filed on Mar. 28, 2022, Machine Translation, 14 pages.

* cited by examiner

FLEXIBLE COLD PLATE FOR CONTACTING VARIED AND VARIABLE CHIP HEIGHTS

BACKGROUND

The present invention generally relates to the field of heat sinks, and more particularly to using a single heat sink for a plurality of different chips having different vertical heights.

As electronic signaling speeds and bandwidths continue to increase, the electrical channel lengths between electronic components will continue to decrease. This will require multiple chips to be positioned more closely together. Densely packaged multichip modules are likely to include processor chips, network chips and high bandwidth memory chip stacks (HBM). Each HBM stack consists of 4 to 8 chips at current technology levels. This will likely increase to 12 to 16 chips in the future. Processor chips might also be stacked. The effect of stacking chips can lead to an increase in the overall height of the stack chips.

BRIEF SUMMARY

Additional aspects and/or advantages will be set forth in part in the description which follows and, in part, will be apparent from the description, or may be learned by practice of the invention.

An apparatus comprising chips mounted to a substrate, wherein one or more of the chips comprises a first height and one or more of the chips comprises a second height, wherein the first height is taller than the second height. A cold plate located above the plurality of chips, wherein the cold plate includes a bottom wall and a top wall, wherein the cold plate includes a plurality of cooling fins that are attached to the bottom wall of the cold plate, wherein the cold plate accommodates the plurality of chips, wherein the chips includes chips having the first height and the second height.

BRIEF DESCRIPTION OF THE DRAWINGS

The above and other aspects, features, and advantages of certain exemplary embodiments of the present invention will be more apparent from the following description taken in conjunction with the accompanying drawings, in which.

DETAILED DESCRIPTION

Figure 1:
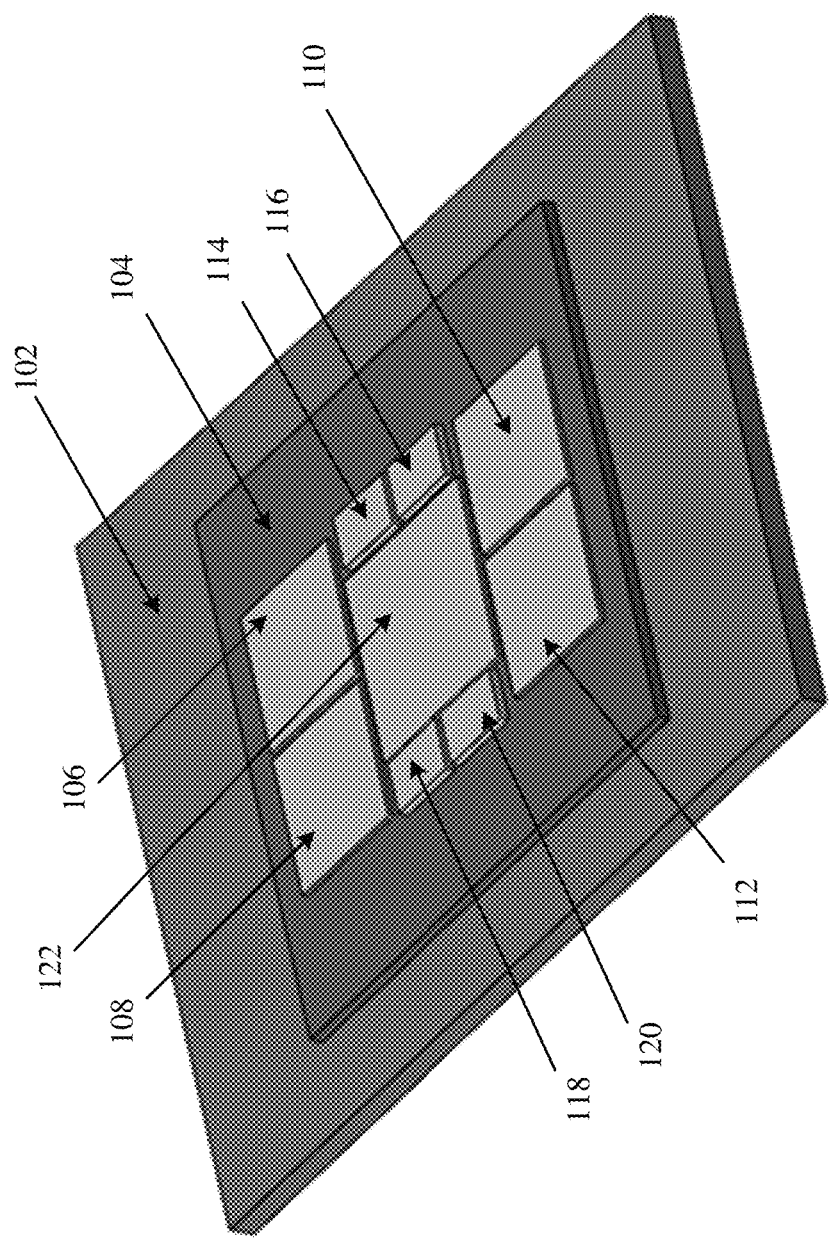
FIG. 1 illustrates a 3D view showing a multi-chip module mounted on a printed circuit board (PCB), in accordance with an embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Reference will now be made in detail to the embodiments of the present invention, examples of which are illustrated in the accompanying drawings, wherein like reference numerals refer to like elements throughout. Stacking of components or chips is causing an increase to the heat generated per chip stack. Stacking of components or chips is also causing height variations between different types of chips that need to be in close proximity to each other. Stacking of components and having chips in proximity is causing the heat generated by the chips to increase. Cooling technology needs to keep up the increased heat generation to keep the chip temperature below their thermal limits. The present invention is directed towards a heat sink/cold plate that can accommodate a plurality of chips in close proximity to each other, chips of the same height, and/or chips having a different height.

FIG. 1 illustrates a 3D view showing a multi-chip module mounted on a printed circuit board (PCB) 102, in accordance with an embodiment of the present invention.

A printed circuit board (PCB) 102 can have a plurality of chips mounted to the top surface of the PCB 102. The plurality of chips 106, 108, 110, 112, 114, 116, 118, 120 and 122 are soldered on top of a substrate 104. The chips 106, 108, 110, 112, 114, 116, 118, 120 and 122 can be arranged in any desired pattern. Some chips 110 and 116 are in close proximity to each other, and some chips 110 and 106 are farther apart from each other. Chips 106, 108, 110, 112, 114, 116, 118, 120 and 122 can have dimension that vary from each other. For example, chips 106, 108, 110, 112, and 122 are wider than other chips 114, 116, 118, and 120. Furthermore, the height of the chips 106, 108, 110, 112, 114, 116, 118, 120 and 122 can vary. For example, chips 114, 116, 118, and 120 can be taller than other chips 106, 108, 110, 112, and 122.

Figure 2:
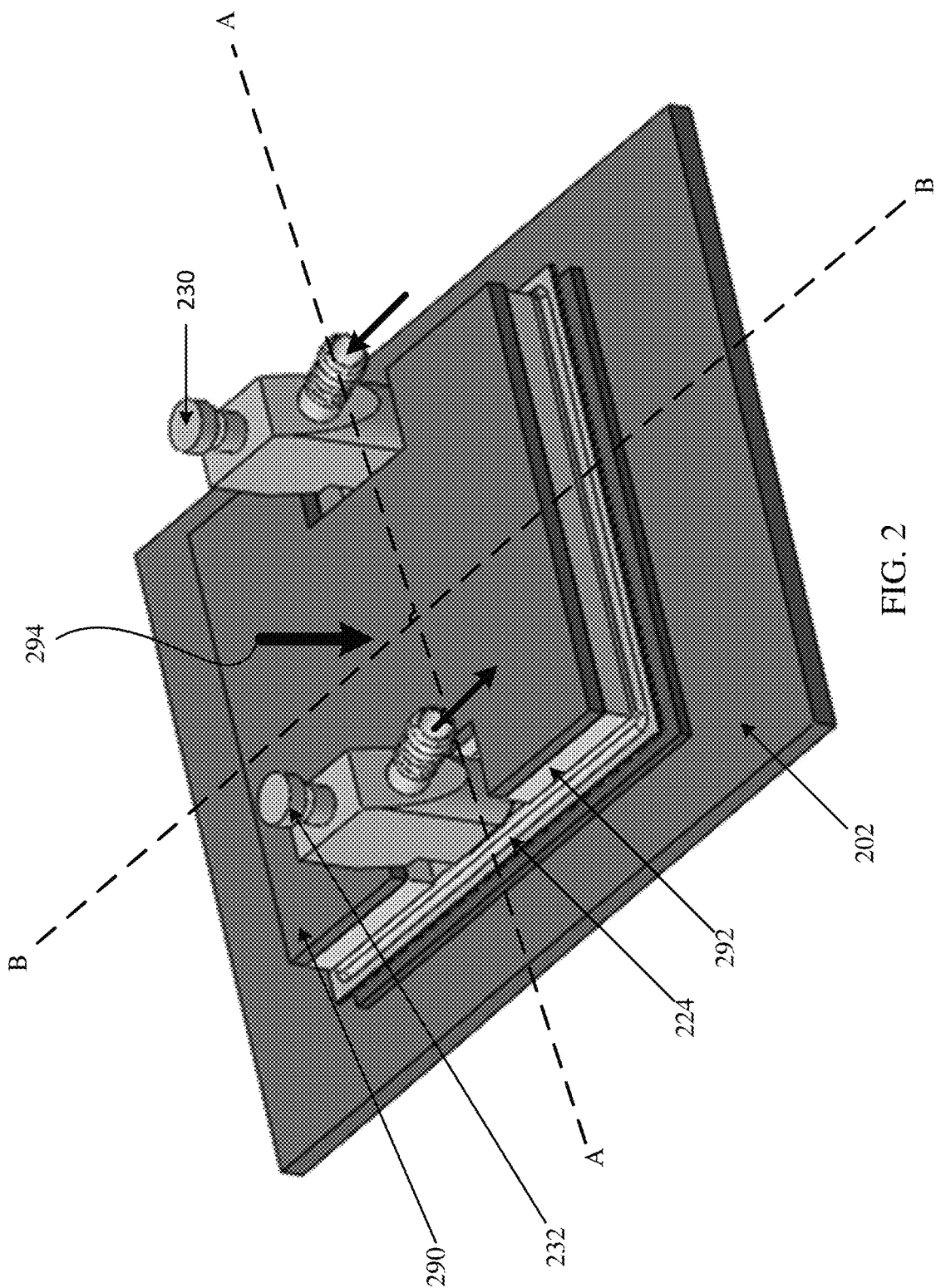
FIG. 2 illustrates a 3D view showing the multi-chip module mounted on a PCB with a cold plate and a loading mechanism on located on top of the PCB, in accordance with an embodiment of the present invention.

FIG. 2 illustrates a 3D view of a multi-chip module mounted on a PCB 202 with a cold plate 224 and a loading mechanism located on top of the PCB 202. The cold plate 224 is mounted on top of the chips (not shown) and an absorbent layer 292 (for example, rubber) is mounted on top of the cold plate 224. A metal plate 290 is mounted on top of the absorbent layer 292. The metal plate 290 and the absorbent layer 292 have cutouts to accommodate an inlet fitting 230 and an outlet fitting 232. Cooling liquid enters the inlet fitting 230, the liquid travels through the cold plate 224, and the liquid exits through the outlet fitting 232. The cold plate 224 absorbs heat from the chips and the cooling liquid removes the heat from cold plate 224. A loading force 294 was applied to the top of the metal plate 290. The loading force 294 was transferred from the metal plate 290 through the absorbent layer 292, the cold plate 224, and a thermal interface material to the multi-chip module located beneath the cold plate 224. FIG. 2 identifies cross sections A and B of the PCB which be describe in further details below.

Figure 3:
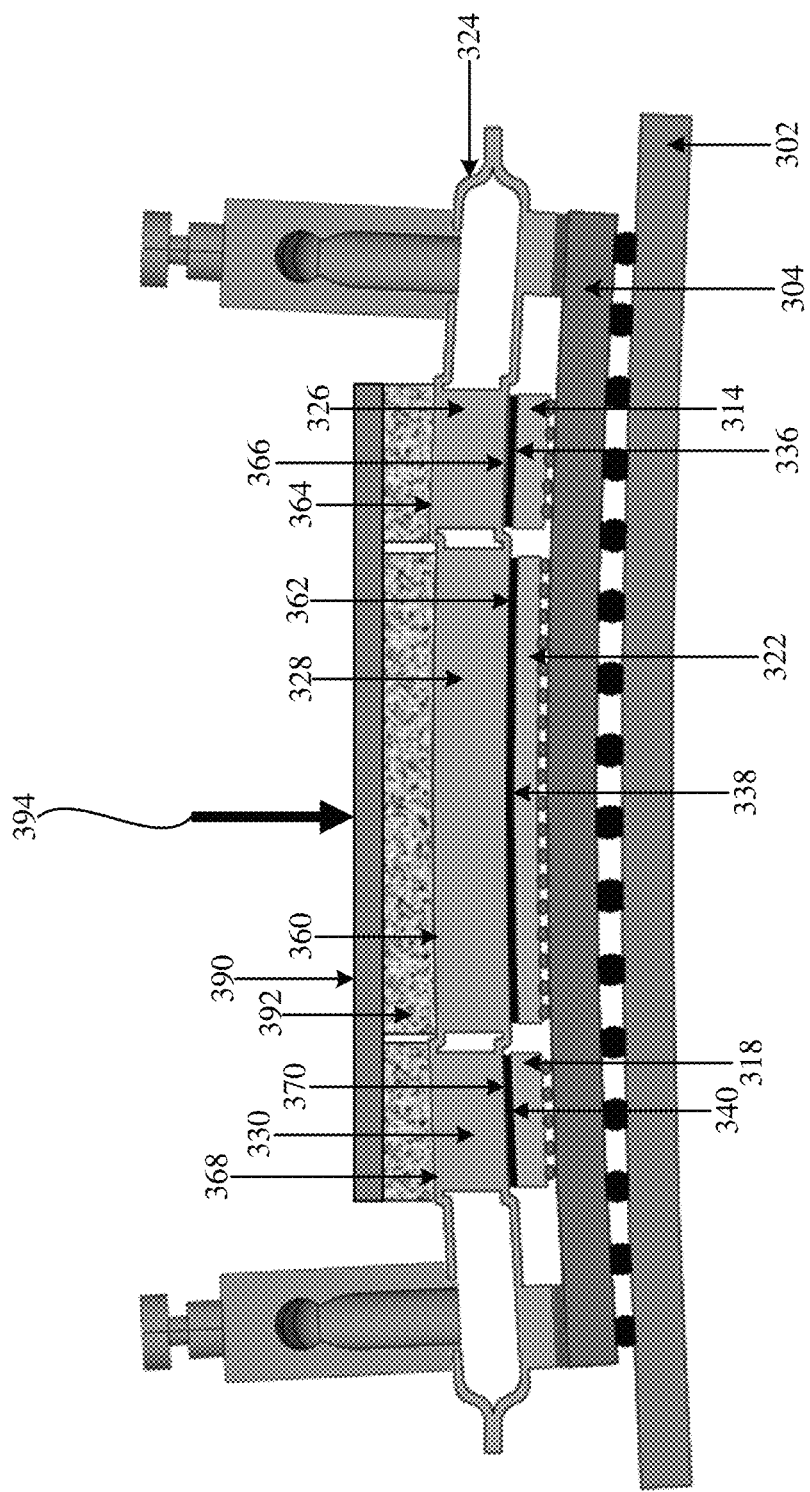
FIG. 3 illustrates cross-section A of a multi-chip module mounted on a PCB with a straight fin cold plate, in accordance with an embodiment of the present invention.

FIG. 3 illustrates cross-section A of a multi-chip module mounted on a PCB 302 with a straight fin cold plate 324. Chips 314, 318 and 322 mounted on a substrate 304 and a cold plate 324 is located on top of the chips 314, 318, and 322. The chips 314, 318, and 322 have different heights, for example, chips 314 and 318 are taller than chips 322. The bottom of the cold plate 324 comprises different sections 362, 366, and 370 to accommodate chips 314, 318 and 322. The bottom of the cold plate 324 is stepped to have different dimensions, such that sections 370 and 364 are higher than section 362. The higher sections 364 and 370 accommodates the taller chips 314 and 318. A thermal interface material 336, 338, and 340 is located between the chips 314, 318, and 322 and the bottom sections 364, 362, and 370 of the cold plate 324. The top of the cold plate 324 has different top sections 360, 364, and 368. The cold plate 324 has a stepped design such that the different sections are higher than other sections to accommodate chips of different heights. The top sections 364 and 368 are higher than top section 360 to accommodate the raised bottom sections 370 and 366. The top sections 364 and 368 are raised so that the fins 326, 328, 330 are all the same height in all sections of the cold plate 324. Fins 326, 328, and 330 are comprised of straight fins. The loading force 394 was applied to the top of the metal plate 390 for the chips 314, 318 and 322 to have a good thermal contact through the thermal interface material 336, 338 and 340, respectively. The loading force 394 was transferred from a metal plate 390 through an absorbent plate 392 (e.g., rubber), the cold plate 324, the thermal interface material 336, 338 and 340 to the chips 314, 318 and 322. The top sections 360, 364 and 368 and bottom sections 362, 366 and 370 of the cold plate 324 have a small thickness. The small thickness of top sections 360, 364 and 368 and bottom sections 362, 366 and 370 allow for the cold plate 324 to be flexible in a vertical dimension and a lateral dimension. The cold plates 324 flexible in the vertical dimension and the lateral dimension allows for variance in the chip height caused by the manufacture process. For example, the chip might be designed to have a vertical height of H1 but because of manufacturing tolerance the chip can end up with a vertical height of H2, where H2 can be smaller than or larger than H1. The small thickness top wall sections 360, 364 and 368 and bottom sections 362, 366 and 370 of the cold plate 324 can be bent into a dome shape to get a low thermal resistance across the thermal interface material 336, 338, and 340. The domed shape of the cold plate 324 will be aligned with the dome shape of the multi-chip module. The domed shape of the multi-chip module was caused by the multi-chip module thermal cycle.

Figure 4:
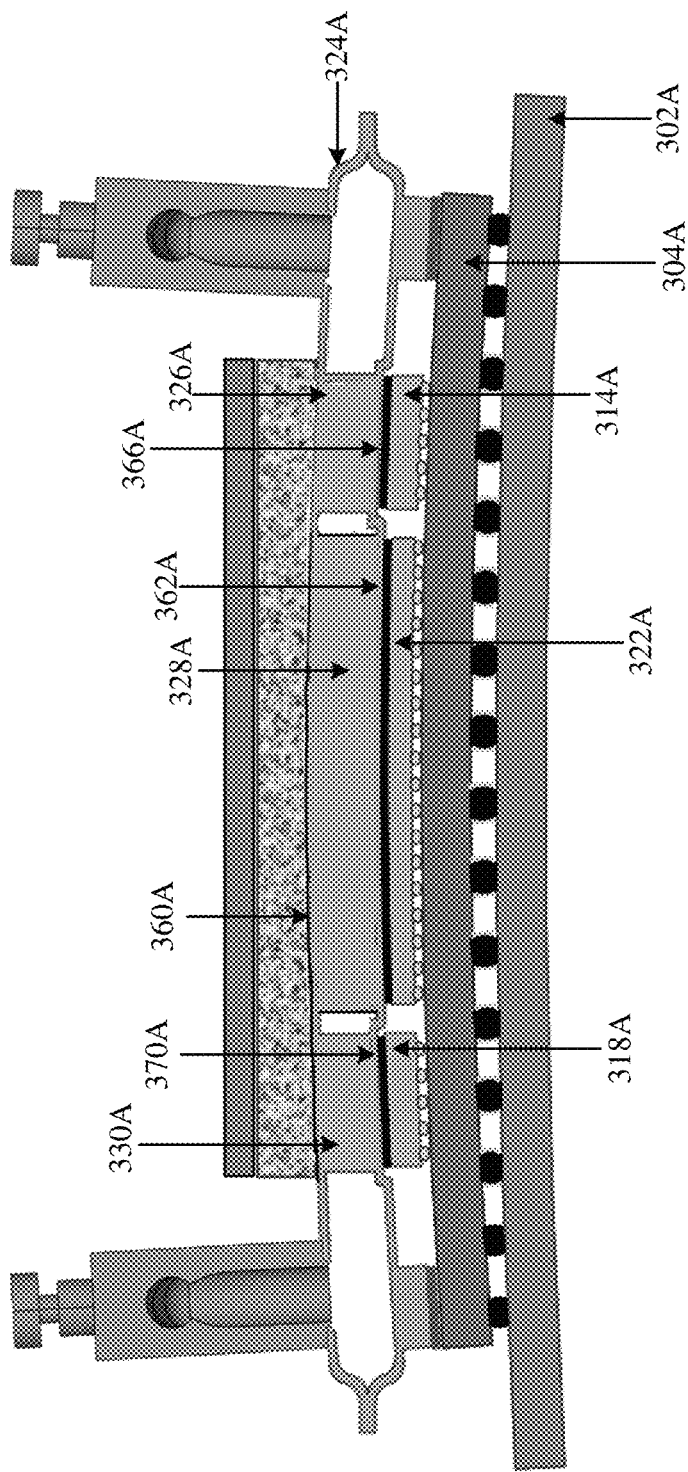
FIG. 4 illustrates cross-section A of a multi-chip module mounted on a PCB with a straight fin cold plate, in which the fins have different heights, in accordance with an embodiment of the present invention.

FIG. 4 illustrates cross-section A of a multi-chip module mounted on a PCB 302A with a straight fin cold plate 324A, in which the fins have different heights. Chips 314A, 318A and 322A mounted on a substrate 304A and a cold plate 324A is located on top of the chips 314A, 318A, and 322A. The chips 314A, 318A, and 322A have different heights, for example, chips 314A and 318A are taller than chips 322A. The bottom of the cold plate 324A comprises different sections 362A, 366A, and 370A that are formed in steps to accommodate chips 314A, 318A and 322A. The top wall 360A of the cold plate 324A is flat and parallel to the bottom sections 362A, 366A and 370A. The fin height extends from the bottom sections 362A, 366A and 370A to the top wall 360A of the cold plate 324A. Since the bottom sections 362A, 366A and 370A can be higher or lower than each other, then the height of the fins 326A, 328A and 330A can vary from section to section. The top wall 360A of the cold plate 324A is not step as illustrated by FIG. 4, in contrast to the step top sections 360, 364 and 368 as illustrated by FIG. 3.

Figure 5:
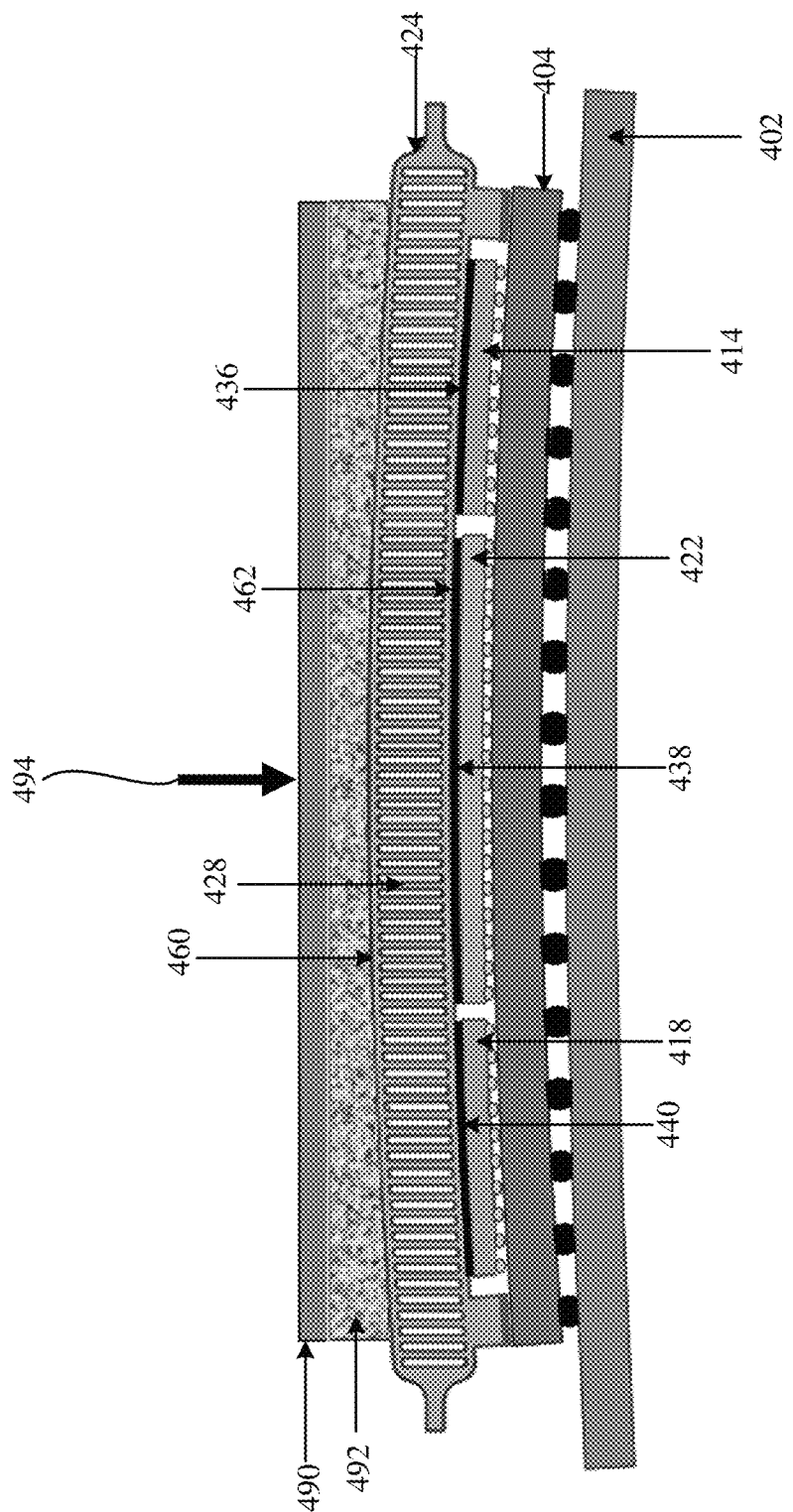
FIG. 5 illustrates cross-section B of a multi-chip module mounted on a PCB with a straight fin cold plate, in accordance with an embodiment of the present invention.

FIG. 5 illustrates cross-section B showing a multi-chip module mounted on a PCB 402 with a straight fin cold plate 424. The closely positioned chips 414, 418 and 422 are mounted on substrate 404, where the chips 414, 418 and 422 have roughly the same height. A thermal interface material 436, 438, and 440 is mounted at top of the chips 414, 418, 422, respectively. The bottom wall 462 of the cold plate 424 is uniform, but the bottom wall 462 has a thickness that allows for bending of the cold plate 424. A force 494 is applied to the metal plate 490 and is transferred by the absorbent layer 492 (for example, rubber) to the cold plate 424. The cold plate 424 can flex in the lateral dimensions and the vertical dimensions to accommodate the bend of substrate 404. The top wall 460 is parallel to the bottom wall 462 of the cold plate 424.

Figure 6:
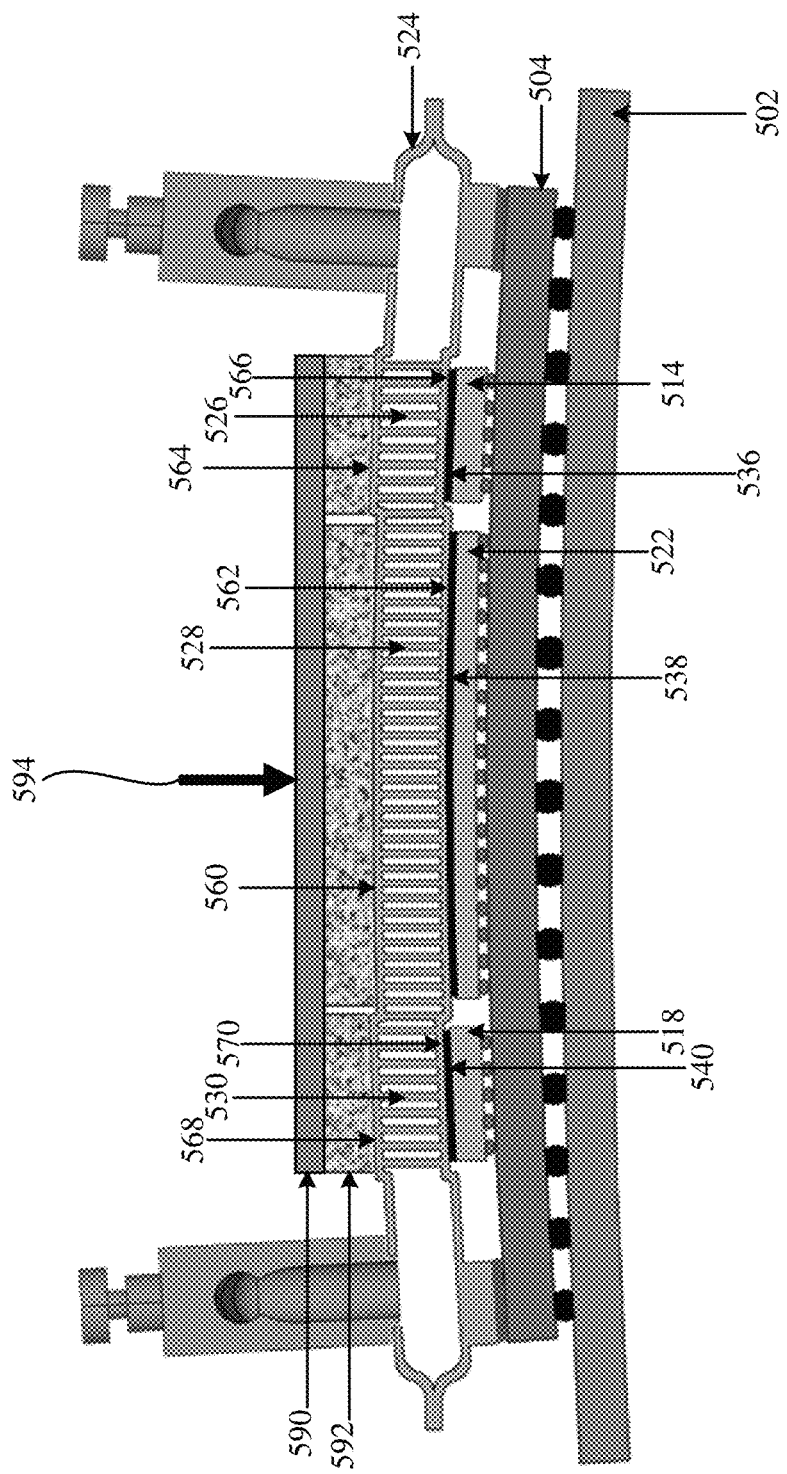
FIG. 6 illustrates cross-section A of a multi-chip module mounted on a PCB with a pin fin cold plate, in which the fins have the same height, in accordance with an embodiment of the present invention.

FIG. 6 illustrates cross-section A of a multi-chip module mounted on a PCB 502 with a pin fin cold plate 524, in which the fins have the same height. Chips 514, 518, and 522 are mounted to substrate 504. The chips 514, 518, and 522 have different vertical heights, for example, chips 514 and 518 are taller in height than chip 522. Similarly, as shown in FIG. 3, the bottom sections 562, 566 and 570 of the cold plate 524 are different heights to accommodate chips 514, 518 and 522, respectively. The distance between the top sections 560, 564 and 568 and the bottom sections 562, 566 and 570 of the cold plate 524, respectively are the same. Therefore, fins 526, 528 and 530 in each section have the same height. Fins 526, 528, and 530 are comprised of pin fins. A thermal interface layer 536, 538, and 540 is located between the chips 514, 522, 518, and the bottom sections 562, 566, and 570, respectively. A loading force 594 was applied to the top of a metal plate 590. The loading force 594 is transfer through the metal plate 590, to an absorbent plate 592 (e.g., rubber), to the cold plate 524, to the thermal interface material 536, 538 and 540, and to the chip 514, 518 and 522. The top sections 560, 564, 568 and bottom sections 562, 566, 570 of the cold plate 524 have a relatively small thickness. The cold plate 524 is flexible in three dimensions, vertical dimension and two lateral dimensions, because of the relatively small thickness top wall sections 560, 564, 568, the bottom wall sections 562, 566, 570 and the pin fins 526, 528, and 530. The loading force 594 bends the flexible cold plate 524 into a dome shape. The dome shape is caused from warpage of the multiple chip module (substrate) after a thermal cycle. The warped dome shaped multi-chip module, applying the flexible domed shaped cold plate 525 on top of the 514, 518 and 522 will reduce the thermal interface material 536, 538 and 540 thermal resistance.

Figure 7:
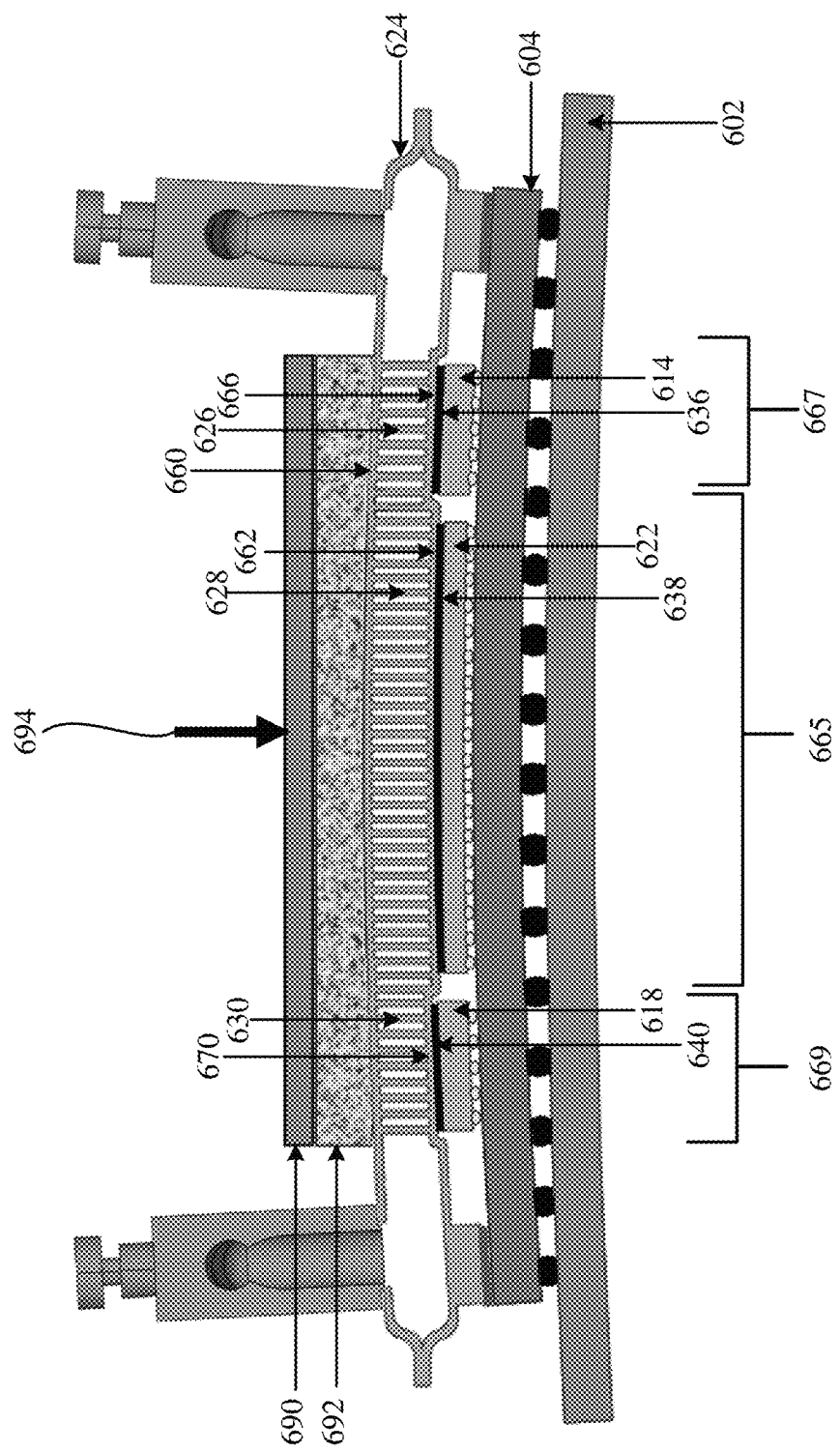
FIG. 7 illustrates cross-section A of a multi-chip module mounted on a PCB with a pin fin cold plate, in which the fins have different heights, in accordance with an embodiment of the present invention.

FIG. 7 illustrates cross-section A of the multi-chip module mounted on a PCB 602 with a pin fin cold plate, in which the fins have different heights. Chips 614, 618, and 622 are mounted to substrate 604. The chips 614, 618, and 622 have different vertical heights, for example, chips 614 and 618 are taller in height than chip 622. Similarly, as shown in FIG. 6, the bottom sections 662, 666 and 670 of the cold plate 624 are different heights to accommodate chips 614, 618 and 622, respectively. The top wall 660 of the cold plate 624 is flat and parallel to the bottom sections 662, 666 and 670. The fin height extends from the bottom sections 662, 666, 670 to the top of the cold plate 624. Since the bottom sections 663, 666, and 670 can be higher or lower than each other, then the height of the fins 626, 628 and 630 can vary from section to section. As illustrated in FIG. 6, the height of the fins 626 and 630 in left and right sections 667 and 669 is less than the height of the fin 628 in middle section 665. A loading force 694 was applied to the top of a metal plate 690. The loading force 694 is transfer through the metal plate 690, to an absorbent plate 692 (e.g., rubber), to the cold plate 624, to the thermal interface material 636, 638 and 640, and to the chip 614, 618 and 622. The top wall 660 and bottom sections 662, 666 and 670 of the cold plate 624 have a relatively small thickness. The cold plate 624 is flexible in three dimensions, vertical dimension and two lateral dimensions, because of relatively small thickness top wall 660, the bottom wall sections 662, 666, 670 and the pin fins 626, 628 and 630. The loading force 694 bends the flexible cold plate 624 into a dome shape. The dome shape is caused from warpage of the multiple chip module (substrate) after a thermal cycle. The warped dome shaped multi-chip module, applying the flexible domed shaped cold plate 624 on top of the 614, 618 and 622 will reduce the thermal interface material 636, 638 and 640 thermal resistance.

Figure 8:
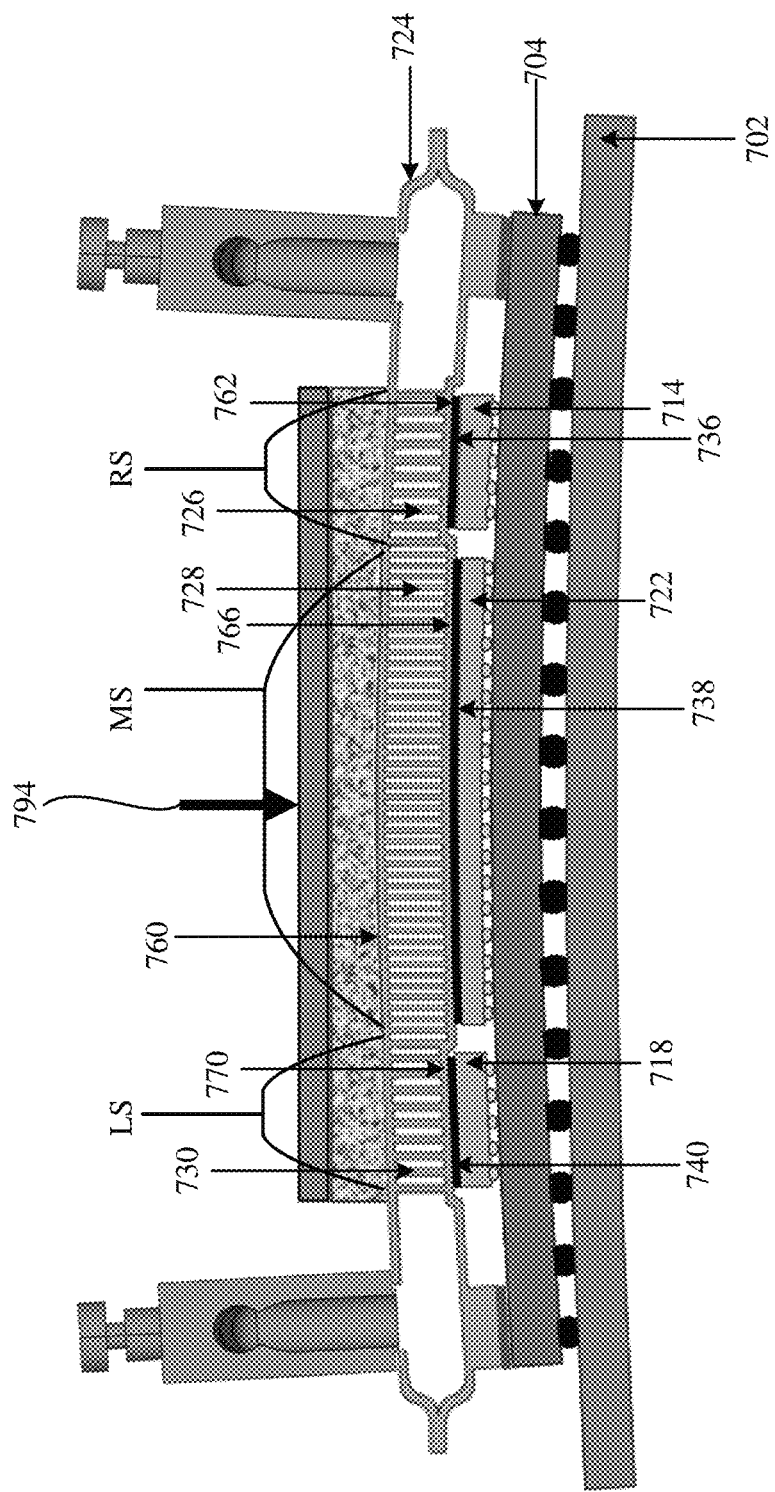
FIG. 8 illustrates cross-sectional A of a multi-chip module mounted on a PCB with a pin fin cold plate, in which the fins have different fin heights and pitches, in accordance with an embodiment of the present invention.

FIG. 8 illustrates cross-section A of the multi-chip module mounted on a PCB 702 with a pin fin cold plate on top, in which the fins have different fin heights and pitches (i.e., the spacing between fins in each section). Chips 714, 718, and 722 are mounted to substrate 704. The chips 714, 718, and 722 have different vertical heights, for example, chips 714 and 718 are taller in height than chip 722. Similarly, as shown in FIG. 6, the bottom sections 762, 766 and 770 of the cold plate 724 are different heights to accommodate chips 714, 718 and 722, respectively. The top wall 760 of the cold plate 724 is flat and parallel to the bottom sections 762, 766 and 770. The cold plate 724 includes a left section LS, a middle section MS, and a right section RS. The fin height is constant within each of the left section LS, the middle section MS, and the right section RS. The fin height can vary from section to section. For example, the fin height in the left section LS can be smaller than the fin height in the middle section MS, or fin height in the left section LS can be about the same as the fin height in the right section RS. The fin pitch, e.g., the spacing between the fins within the section is constant within an individual section. However, the fin pitch can be different from section to section. For example, the pitch of the fins 726 in the right section RS can be larger than the pitch of the fins 728 in the middle section MS, or the pitch of the fins 730 in the left section LS can be about the same as the pitch of the fins 726 in the right section RS. Similarly, as shown in FIG. 6, the cold plate 724 will be flexible in three dimensions. Corresponding the multi-chip module warpage dome shape, the cold plate 724 can be bended in the same dome shape after applying the loading force 794. Same as shown in FIG. 6, the cold plate 724 can be fabricated in the same domed shape as the multi-chip module warpage dome shape.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. An apparatus comprising:
   chips mounted to a substrate, wherein one or more of the chips comprises a first height and one or more of the chips comprises a second height, wherein the first height is taller than the second height;
   a cold plate located above the chips, wherein the cold plate includes a bottom wall and a top wall, wherein the top wall is a uniform surface profile as the top wall traverses the cold plate, wherein the cold plate includes a plurality of cooling fins that are attached to the bottom wall of the cold plate, wherein the cold plate is flexible in a lateral dimension and vertical dimension, such that, the entire cold plate bends to accommodate the one or more chips having the first height and the one or more chips having the second height.

2. The apparatus of claim 1, wherein the bottom wall of the cold plate comprises a stepped profile that corresponds with and accommodates the one or more chips comprising the first height and the one or more chips comprising the second height.

3. The apparatus of claim 2, wherein the stepped profile of the bottom wall has a first step to accommodate the one or more chips comprising the first height, and wherein stepped bottom wall has a second step to accommodate the one or more chips comprising the second height, wherein the first step is raised above the second step.

4. The apparatus of claim 1, wherein the bottom wall comprises different sections, wherein each section of the bottom wall are flexible in a vertical dimension and at least one lateral dimension to accommodate manufacturing variations in the height of each of the plurality of chips.

5. The apparatus of claim 4, wherein the cold plate is comprised of a plurality of regions where each region is comprised of the top wall and a corresponding bottom wall section, wherein the distance between the top wall and the corresponding section of the bottom wall is constant between each region of the plurality of regions of the cold plate.

6. The apparatus of claim 5, wherein a vertical height of the plurality of cooling fins is the same in each of the regions of the cold plate, wherein the vertical height is the distance of the cooling fin between the top wall and the corresponding bottom wall in each region of the cold plate.

7. The apparatus of claim 6, wherein the plurality of cooling fins have a constant spacing between each of the cooling fins in each of the regions of the cold plate.

8. The apparatus of claim 5, wherein the plurality of cooling fins have a constant spacing of the cooling fins within each region of the cold plate, wherein the spacing of the cooling fins are different from a first region to a second region of the plurality of regions of the cold plate.

9. The apparatus of claim 4, wherein the cold plate is comprised of a plurality of regions where each region is comprised of the top wall and a corresponding bottom wall section, wherein the distance between the top wall and the corresponding section of the bottom wall can vary between each region of the plurality of regions the cold plate.

10. The apparatus of claim 9, wherein a vertical height of the plurality of cooling fins is different in each of the regions of the cold plate, wherein the vertical height is the distance of the cooling fin between the top wall and the corresponding bottom wall in each region of the cold plate.

11. The apparatus of claim 10, wherein a first vertical height of the plurality of cooling fins located in a first region of the plurality of regions for the cold plate where the bottom wall is raised to accommodate taller chips, wherein a second vertical height of the plurality of cooling fins located in a second region of the plurality of regions for the cold plate where the bottom wall is lower to accommodate smaller chips, wherein the first vertical height is smaller than the second vertical height.

12. The apparatus of claim 10, wherein a first vertical height of the plurality of cooling fins located in a first region of the plurality of regions for the cold plate where the bottom wall is stepped up to accommodate taller chips, wherein a second vertical height of the plurality of cooling fins located in a second region of the plurality of regions for the cold plate where the bottom wall is stepped down to accommodate smaller chips, wherein a third vertical height of the plurality of cooling fins located in a third region of the plurality of regions for the cold plate where the bottom wall is stepped up to accommodate taller chips, wherein the first vertical height is smaller than the second vertical height, wherein the first vertical height is about the same as third vertical height.

13. The apparatus of claim 10, wherein the plurality cooling fins have a constant spacing between each of the cooling fins in each of the regions of the cold plate.

14. The apparatus of claim 10, wherein the plurality cooling fins have a constant spacing of the cooling fins within each region of the cold plate, wherein the spacing of the cooling fins are different from a first region to a second region of the plurality of regions of the cold plate.

15. An apparatus comprising:
chips mounted to a substrate, wherein one or more of the chips comprises a first height and one or more of the chips comprises a second height, wherein the first height is taller than the second height;
a cold plate located above the chips, wherein the cold plate includes a bottom wall and a top wall, wherein the top wall is a uniform surface profile as the top wall traverses the cold plate, wherein the cold plate includes a plurality of cooling fins that are attached to the bottom wall of the cold plate, wherein a bottom wall of the cold plate is flexible in a vertical dimension and at least one lateral dimension to accommodate manufacturing variations in the height of the chips, wherein the cold plate has at least one section where the bottom wall is a uniform height to accommodate chips having the same height, and wherein the cold plate has at least one section where the bottom wall has a stepped profile to accommodate chips that includes the one or more chips comprising the first height and the one or more chips comprising the second height, wherein the cold plate is flexible in a lateral dimension and vertical dimension, such that, the entire cold plate bends to accommodate the chips having the first height and the second height.

16. An apparatus comprising:
a plurality of chips, wherein one or more of the chips comprises a first height and one or more of the chips comprises a second height, wherein the first height is taller than the second height;
a cold plate located above the plurality of chips, wherein the cold plate includes a bottom wall and a top wall, wherein the cold plate includes a plurality of cooling fins that are attached to the bottom wall of the cold plate, wherein the cold plate is flexible in a lateral dimension and vertical dimension, such that, the entire cold plate bends to accommodate the chips having the first height and the second height, wherein the cold plate is bent into a dome shape to correspond to the arc shape of a substrate, wherein the top wall is a uniform surface profile as the top wall traverses the cold plate.

17. The apparatus of claim 16, wherein the bottom wall comprises different sections, wherein each section of the different sections of the bottom wall are flexible in a vertical dimension and at least one lateral dimension to accommodate manufacturing variations in the height of each of the plurality of chips.

18. The apparatus of claim 17, wherein the top wall comprises a plurality of sections, wherein the cold plate is comprised of a plurality of regions where each region is comprised of one top wall section of the plurality of top wall sections and a corresponding bottom wall section, wherein the distance between the sections of the top wall and the corresponding section of the bottom wall is constant between each region of the plurality of regions of the cold plate.

19. The apparatus of claim 17, wherein the cold plate is comprised of a plurality of regions where each region is comprised of the top wall and a corresponding bottom wall section, wherein the distance between the top wall and the corresponding section of the bottom wall is different between each region of the plurality of regions of the cold plate.

* * * * *